(12) United States Patent
Schlösser et al.

(10) Patent No.: US 6,448,600 B1
(45) Date of Patent: Sep. 10, 2002

(54) DRAM CELL CONFIGURATION AND FABRICATION METHOD

(75) Inventors: Till Schlösser; Franz Hofmann, both of München; Josef Willer, Riemerling, all of (DE)

(73) Assignee: Infineon Technologies AG, Munich (DE)

( * ) Notice: Subject to any disclaimer, the term of this patent is extended or adjusted under 35 U.S.C. 154(b) by 86 days.

(21) Appl. No.: 09/713,484

(22) Filed: Nov. 15, 2000

(30) Foreign Application Priority Data

Nov. 15, 1999 (DE) .......................... 199 54 867

(51) Int. Cl.$^7$ ......................................... H01L 21/8242
(52) U.S. Cl. ...................... 257/302; 438/243; 438/272; 438/246; 438/248
(58) Field of Search ............................. 438/243, 272, 438/FOR 202, FOR 212, 246, 248; 257/302

(56) References Cited

U.S. PATENT DOCUMENTS

| 5,831,301 A | * 11/1998 | Horak et al. ................. 257/296 |
| 5,834,805 A | * 11/1998 | Tang ........................... 257/301 |
| 5,905,279 A | * 5/1999 | Nitayama et al. ........... 257/301 |
| 5,959,322 A | * 9/1999 | Lee ............................. 257/296 |
| 6,037,620 A | * 3/2000 | Hoenigschmid et al. ..... 257/296 |
| 6,172,391 B1 | * 1/2001 | Goebel et al. ............... 257/302 |
| 6,177,698 B1 | * 1/2001 | Gruening et al. ............ 257/302 |
| 6,320,215 B1 | * 11/2001 | Bronner et al. ............. 257/301 |
| 6,333,533 B1 | * 12/2001 | Furukawa et al. ........... 257/296 |

* cited by examiner

Primary Examiner—George Fourson
Assistant Examiner—Thanh Pham
(74) Attorney, Agent, or Firm—Laurence A. Greenberg; Werner H. Stemer; Ralph E. Locher

(57) ABSTRACT

The memory cells each have a capacitor and a transistor. A storage node of the capacitor is arranged in a first depression formed in a substrate. A gate electrode of the transistor is arranged in a second depression at a first lateral surface of the second depression. The second depression is spaced apart from the first depression. An upper source/drain region of the transistor adjoins the storage node and the second depression. A lower source/drain region of the transistor is formed deeper in the substrate than the upper source/drain region and it adjoins the second depression.

20 Claims, 5 Drawing Sheets

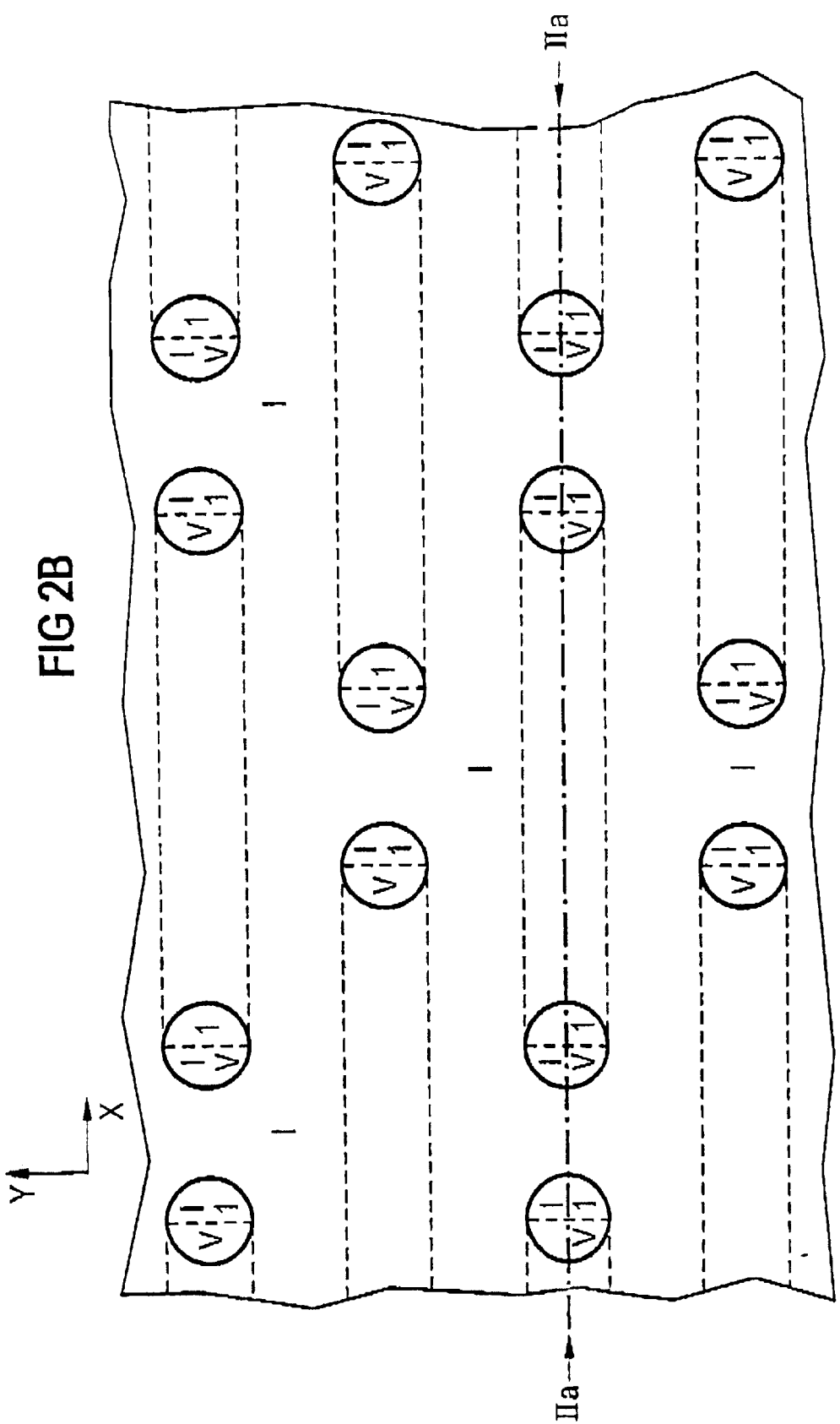

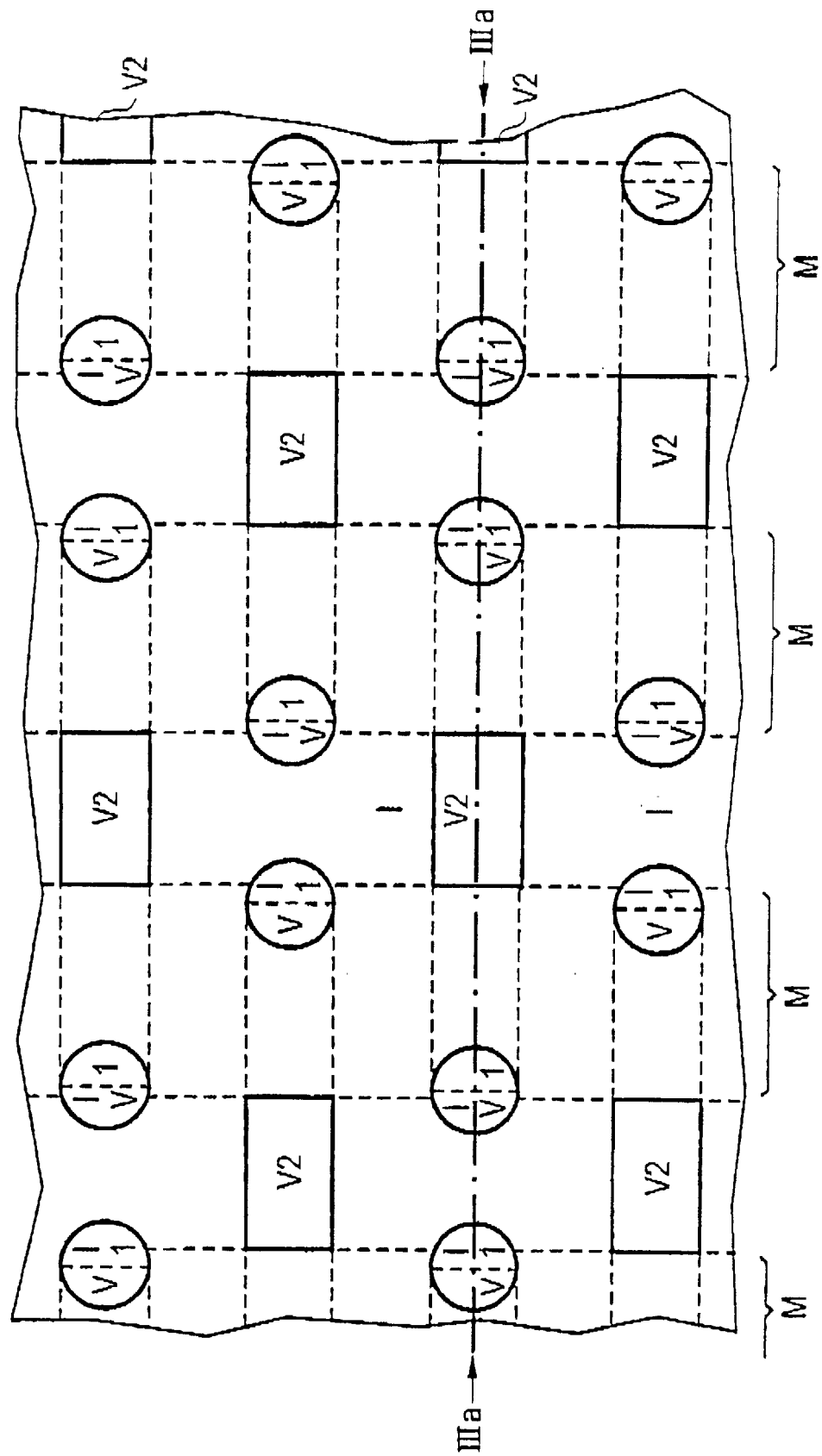

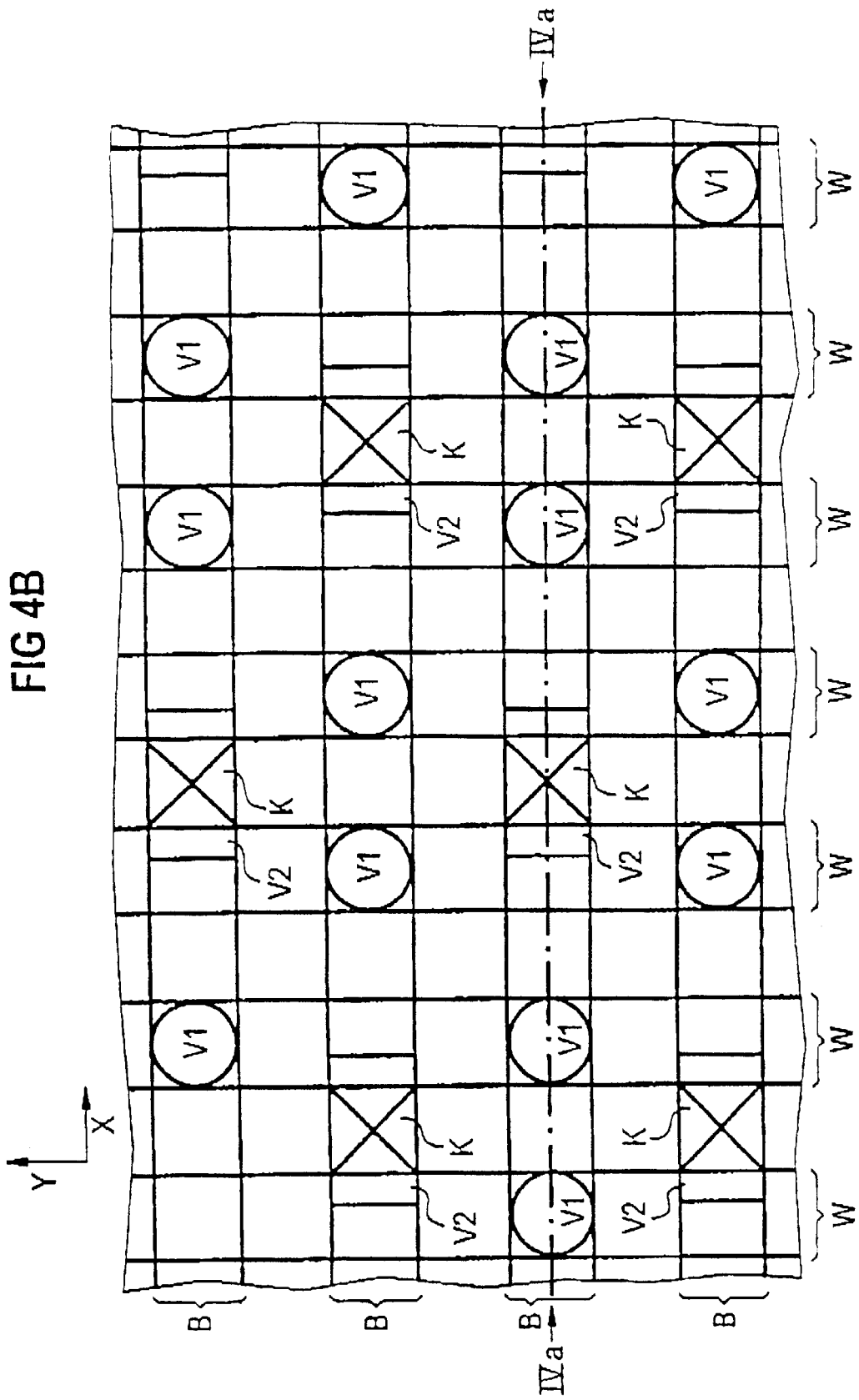

DRAM CELL CONFIGURATION AND FABRICATION METHOD

BACKGROUND OF THE INVENTION

Field of the Invention

The invention relates to a DRAM cell configuration, that is to say a dynamic random access memory cell configuration, and to a method for fabricating the same.

At the present time, use is made almost exclusively of a so-called one-transistor memory cell, comprising a transistor and a capacitor, as the memory cell of a DRAM cell configuration. The information of the memory cell is stored in the form of a charge on the capacitor. The capacitor is connected to the transistor, so that when the transistor is driven via a word line, the charge of the capacitor can be read out via a bit line.

A DRAM cell configuration of this type is disclosed in European published patent application EP 0 852 396 A2 for example. A storage node of a capacitor is arranged in a lower region of a depression of a substrate. Above the storage node, a gate electrode of a vertical transistor is arranged in the depression. The gate electrode is insulated by a gate dielectric. Except for a recess in the region of the gate electrode, the storage node is isolated from the substrate by a capacitor dielectric. A lower source/drain region of the transistor is arranged in the region in which the storage node directly adjoins the substrate. An upper source/drain region of the transistor is arranged above the lower source/drain region and adjoins a surface of the substrate and the depression. The upper source/drain region is connected to a bit line.

SUMMARY OF THE INVENTION

The invention is based on the object of specifying a further DRAM cell configuration whose memory cells each have a transistor and a capacitor. It is a further object of the invention to specify a method for fabricating such a DRAM cell configuration.

With the above and other objects in view there is provided, in accordance with the invention, a DRAM cell configuration, comprising:
- a plurality of memory cells each having a vertical capacitor and a transistor;
- a substrate having formed therein a first depression and a second depression spaced apart from the first depression;
- the capacitor being formed as a vertical capacitor having a storage node disposed in the first depression, and a capacitor dielectric in the first depression between the storage node and the substrate;
- the storage node adjoining the substrate at least in a contact region of a lateral surface of the first depression;
- the transistor having a gate electrode in the second depression at least at a first lateral surface of the second depression;
- a gate dielectric adjoining at least the first lateral surface and isolating the gate electrode from the substrate;
- the transistor having an upper source/drain region disposed in the substrate adjoining the second depression, and adjoining the storage node in a contact region of the lateral surface of the first depression; and
- the transistor having a lower source/drain region disposed deeper in the substrate than the upper source/drain region and adjoining the second depression.

In other words, the DRAM cell configuration has memory cells each having a capacitor and a transistor. The transistor is configured as a vertical transistor. A storage node of the capacitor is arranged in a first depression of the substrate. A capacitor dielectric is arranged in the first depression and is arranged between the storage node and the substrate. The storage node adjoins the substrate at least in a contact region of a lateral surface of the first depression. A second depression of the substrate is provided, which second depression is spaced apart from the first depression. A gate electrode of the transistor is arranged in the second depression at least at a first lateral surface of the second depression and is isolated from the substrate by a gate dielectric, which adjoins at least the first lateral surface. An upper source/drain region of the transistor is arranged in the substrate in such a way that it adjoins the second depression and, in the contact region of the lateral surface of the first depression, the storage node. A lower source/drain region of the transistor is arranged more deeply in the substrate than the upper source/drain region. The lower source/drain region adjoins the second depression.

The object is furthermore achieved by means of a method for producing a DRAM cell configuration in which memory cells each having a capacitor and a transistor are produced. The transistor is produced as a vertical transistor. A first depression is produced in a substrate for the capacitor. The first depression is provided with a capacitor dielectric. A storage node of the capacitor is produced in the first depression. The storage node is produced in such a way that it adjoins the substrate at least in a contact region of a lateral surface of the first depression. A second depression is produced, which is spaced apart from the first depression. A gate electrode of the transistor is produced in the second depression at least at a first lateral surface of the second depression and is isolated from the substrate by a gate dielectric, which is produced such that it adjoins at least the first lateral surface. An upper source/drain region of the transistor is produced in such a way that it adjoins the second depression and, in the contact region of the lateral surface of the first depression, the storage node. A lower source/drain region of the transistor is produced in such a way that it is arranged more deeply in the substrate than the upper source/drain region and adjoins the second depression.

The contact region of the lateral surface of the first depression in which the storage node directly adjoins the upper source/drain region is thus located higher than the lower source/drain region of the transistor.

Since different depressions are provided for the capacitor (storage node) and for the transistor (gate electrode), the first lateral surface of the second depression at which the gate dielectric is produced can escape process steps for producing the first depression. This is advantageous since the quality of a surface area on which the gate dielectric of a transistor is produced generally has a major influence on the electrical properties of the transistor. This surface area is preferably fabricated with particular care, so that the transistor has improved electrical properties.

The provision of two different depressions furthermore affords the advantage that the geometry of the area at which the gate dielectric is produced can be independent of a geometry of an area at which the capacitor dielectric is produced. The area at which the gate dielectric is produced is preferably planar, so that it has a defined orientation with regard to the crystal lattice of the substrate, in order that the gate dielectric can grow homogeneously. By contrast, the area at which the capacitor dielectric is produced is preferably curved, so that the capacitor dielectric has no edges at which field distortions can lead to leakage currents. Accordingly, both the transistor and the capacitor can have particularly good electrical properties.

The first lateral surface of the second depression is preferably planar. A horizontal cross section of the first depression is circular or elliptic, for example.

In order to increase the capacitance of the capacitor, it is advantageous if the first depression is deeper than the second depression.

The gate electrode is connected to a word line.

Part of the substrate which adjoins the first depression acts as a capacitor electrode of the capacitor.

By way of example, the lower source/drain region of the transistor is connected to a bit line running transversely with respect to the word line. As an alternative, the capacitor electrode is connected to the bit line.

In order to improve the driving of the transistor by the gate electrode, it is advantageous if the lower source/drain region at least partly adjoins the first lateral surface of the second depression.

The first lateral surface of the second depression may face away from the first depression. In this case, in comparison with remaining lateral surfaces of the second depression, the first lateral surface has a maximum spacing from the first depression. By way of example, the upper source/drain region surrounds the second depression in order that it can adjoin both the first depression and the first lateral surface of the second depression.

In order to increase the packing density of the DRAM cell configuration, it is preferably the case that the first lateral surface of the second depression faces the first depression and the lateral surface of the first depression faces the second depression. In this case, a channel region of the transistor, through which current flows when the transistor is driven, is arranged between the first and second depressions. In order to increase the packing density, it is preferably the case that the upper source/drain region is also arranged between the first depression and the second depression.

In order to simplify the process, the upper source/drain region preferably adjoins a surface of the substrate from which the first depression and the second depression proceed. In this case, the upper source/drain region can be produced by implantation or by in-situ-doped epitaxy. The implantation can be performed before or after the production of the first depression and/or of the second depression.

As an alternative, the upper source/drain region is arranged below the surface of the substrate.

At least part of the lower source/drain region may be arranged under the second depression and adjoin the bottom of the second depression. In order to simplify the process, it is preferably the case that the largest part of the lower source/drain region is arranged under the second depression and adjoins the bottom of the second depression. In this case, the lower source/drain region can be produced by implantation after the production of the second depression in a self-aligned manner at the bottom of the second depression. The upper source/drain region and the lower source/drain region can be produced simultaneously by implantation after the production of the second depression. As an alternative, the lower source/drain region is produced from a doped layer buried in the substrate.

The lower source/drain region may be part of a bit line buried in the substrate.

A bit line contact is preferably arranged in the second depression, which contact reaches down to the lower source/drain region at the bottom of the second depression and is insulated from the gate electrode of the transistor. The bit line contact is connected to the bit line arranged on the bit line contact.

In order to increase the packing density, the storage node preferably adjoins the substrate only in the contact region of the lateral surface of the first depression. Since, in this case, the storage node does not directly adjoin the substrate in regions of further lateral surfaces of the first depression, adjacent memory cells can have a smaller spacing from the storage node without leakage currents arising between the storage node and the memory cells.

It will be understood that is lies well within the scope of the invention for each memory cell to comprise its own first depression and its own second depression.

In order to increase the packing density, each two cells preferably share a second depression. Such a DRAM cell configuration can be configured as follows:

The second depression is assigned to a first memory cell and to a second memory cell. The gate electrode of the transistor of the first memory cell is arranged at the first lateral surface of the second depression. The gate electrode of the transistor of the second memory cell is arranged at a second lateral surface of the second depression, said second lateral surface being opposite the first lateral surface of the second depression, and is isolated from the substrate by the gate dielectric, which also adjoins at least the second lateral surface of the second depression. The gate electrode of the transistor of the second memory cell is isolated from the gate electrode of the transistor of the first memory cell. The second depression is arranged between the first depression of the first memory cell and the first depression of the second memory cell. The lower source/drain region of the transistor of the first memory cell corresponds to the lower source/drain region of the transistor of the second memory cell.

In the case of such a DRAM cell configuration, the bit line contact may be arranged between the gate electrode of the transistor of the first memory cell and the gate electrode of the transistor of the second memory cell and be insulated from the gate electrode of the transistor of the first memory cell and from the gate electrode of the transistor of the second memory cell.

In order to avoid leakage currents between the first memory cell or the second memory cell and memory cells adjacent thereto, it is advantageous to provide an isolation trench filled with an insulation, which trench laterally surrounds the second depression, at least part of the first depression of the first memory cell which encompasses the contact region of the associated lateral surface, and at least part of the first depression of the second memory cell which encompasses the contact region of the associated lateral surface.

In order to simplify the process, the second depression preferably adjoins part of the isolation trench and part of the isolation trench opposite the former part. In this case, the DRAM cell configuration can be produced as follows:

The isolation trench which is filled with the insulation and laterally surrounds a region of the substrate is produced. In order to produce the second depression, with the aid of a mask which does not cover a strip traversing the region of the substrate, the substrate is anisotropically etched selectively with respect to the insulation. The second depression adjoins the isolation trench in a self-aligned manner with two ends and divides the region of the substrate into two halves. The upper source/drain regions of the transistors of the first memory cell and of the second memory cell can be produced isolated from one another in a self-aligned manner since the two halves are isolated from one another by the second depression and by the insulation. Unmasked implantation suffices for producing the mutually isolated upper source/drain regions.

In order to reduce leakage currents, the isolation trench preferably reaches more deeply into the substrate than the lower source/drain region of the transistor of the first memory cell.

The isolation trench may be produced in such a way that, on account of the isolation trench, the storage node adjoins the substrate only in the contact region of the lateral surface of the first depression. To that end, the first depression is produced before the isolation trench is produced. The capacitor dielectric is produced in such a way that it covers a bottom of the first depression and sidewalls of the first depression up to a first depth below the surface of the substrate. After the production of the capacitor dielectric, the storage node is produced in such a way that it fills the first depression at least up to the surface of the substrate. The isolation trench is produced in such a way that it reaches down into the storage node, is deeper than the first depth and overlaps the first depression in such a way that the storage node adjoins the substrate only in the contact region of the lateral surface of the first depression.

As an alternative, the storage node also adjoins the substrate in the region of other lateral surfaces of the first depression.

The DRAM cell configuration can be configured as follows:

The first memory cell and the second memory cell form a pair. A number of pairs configured analogously to said pair are provided. The pairs form rows. A bit line runs along each of the rows. The pairs are arranged in such a way that the first depressions and the second depressions of pairs of a row are arranged next to one another along the row. Word lines run transversely with respect to the rows. Mutually adjacent word lines of said word lines have the same spacing from one another. The word lines and the pairs are arranged in such a way that the word lines in each case alternately cover first depressions and overlap second depressions. The gate electrodes of the transistors of the memory cells are parts of the word lines.

Other features which are considered as characteristic for the invention are set forth in the appended claims.

Although the invention is illustrated and described herein as embodied in a DRAM cell configuration and an associated fabrication method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2B is a plan view of the substrate which illustrates the first depressions and the insulations;

FIG. 3B is a plan view similar to FIG. 2B which illustrates the first depressions, the second depressions and the insulations;

FIG. 4B is a plan view similar to FIG. 3B which illustrates the word lines, the bit lines, the first depressions, the second depressions and the bit line contacts.

It will be understood by those of skill in the pertinent art that the figures are not true to scale.

DESCRIPTION OF THE PREFERRED EMBODIMENTS

Figure 1:
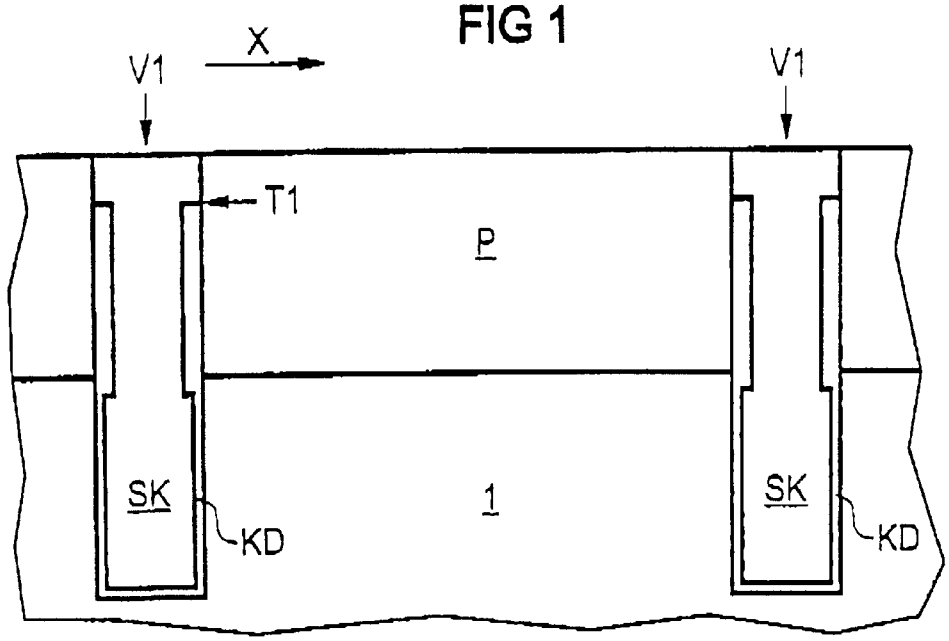
FIG. 1 is a partial sectional view taken through a substrate after a doped layer, first depressions, a capacitor dielectric and storage nodes of capacitors have been produced.

Referring now to the figures of the drawing in detail and first, particularly, to FIG. 1 thereof, there is seen an exemplary embodiment wherein the starting material is a substrate 1 made of monocrystalline silicon which has a p-doped layer P adjoining a surface of the substrate 1. The doped layer P has a dopant concentration of approximately $2 \cdot 10^{17}$ cm$^{-3}$. The rest of the substrate 1 is n-doped, and has a dopant concentration of approximately $10^{19}$ cm$^{-3}$.

First depressions V1 having a depth of approximately 6 μm are produced in the substrate 1 by etching with the aid of a non-illustrated mask made of silicon nitride. The first depressions V1 have a horizontal cross section which is circular and with a diameter of approximately 150 nm. The first depressions V1 form columns running along a Y-axis Y. The Y-axis Y is orthogonal to an X-axis X and it lies in the surface of the substrate 1. Mutually adjacent first depressions V1 (i.e., adjacent to one another along the columns) have a spacing of approximately 450 nm from one another. Mutually adjacent columns are arranged alternately offset and not offset with respect to one another, so that the first depressions V1 form rows running parallel to the X-axis X. The X-axis X runs perpendicular to the Y-axis Y and lies in the surface of the substrate 1. Mutually adjacent depressions of said first depressions V1 of a row alternately have a spacing of approximately 150 nm, and a spacing of approximately 750 nm (see FIG. 4B).

By depositing silicon nitride to a thickness of approximately 5 nm, a first part of a capacitor dielectric KD is produced which covers bottoms and lateral surfaces of the first depressions V1. Afterwards, in-situ-doped polysilicon is deposited to a thickness of approximately 100 nm and etched back to an extent of approximately 1000 nm selectively with respect to silicon nitride. The mask of silicon nitride protects the substrate 1 during this process.

Afterwards, uncovered parts of the first part of the capacitor dielectric KD are removed using hot phosphoric acid, for example.

In order to produce a second part of the capacitor dielectric KD, SiO$_2$ is deposited to a thickness of approximately 50 nm and etched back until the polysilicon is uncovered. Afterwards, in-situ-doped polysilicon is deposited to a thickness of approximately 100 nm and etched back down to a first depth T1 below the surface of the substrate 1. The first depth T1 is approximately 100 nm below the surface of the substrate 1.

Uncovered parts of the second part of the capacitor dielectric KD are removed using NF$_3$, for example.

Afterwards, further in-situ-doped polysilicon is deposited to a thickness of approximately 100 nm and planarized by chemical mechanical polishing until the mask of silicon nitride is uncovered (see FIG. 1). The polysilicon in the first depressions V1 forms storage nodes SK of capacitors.

Figure 2A:
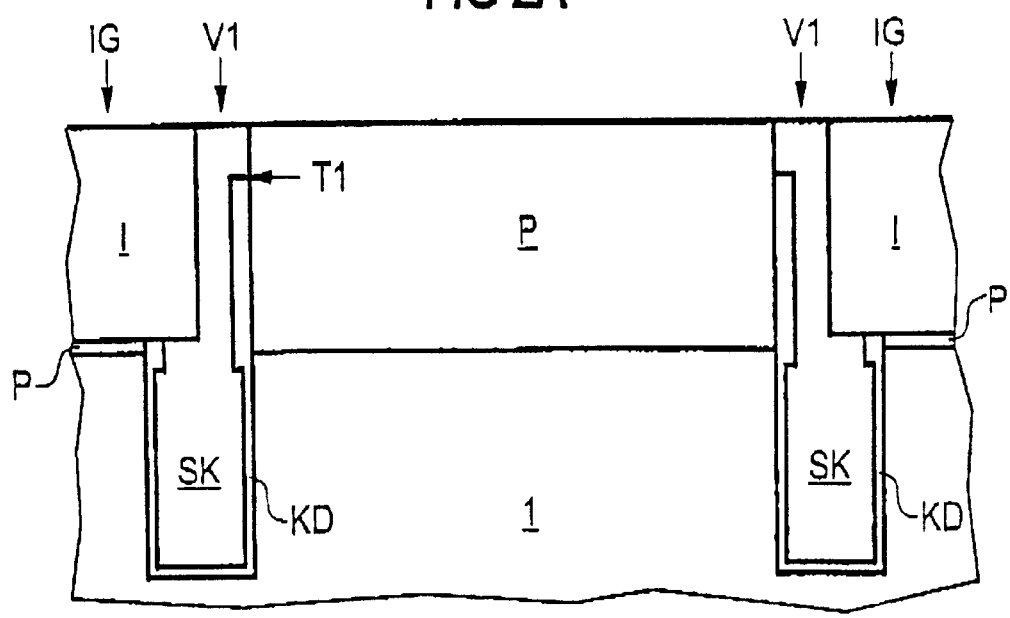
FIG. 2A is a similar section after isolation trenches and insulations have been produced.

Isolation trenches IG having a depth of approximately 600 nm are produced by masked etching, said trenches overlapping the first depressions V1 and reaching down into the storage nodes SK (see FIG. 2A).

The isolation trenches IG each surround parts of two of the first depressions V1 which are adjacent to one another along a row and have the spacing of approximately 750 nm from one another. The isolation trenches IG are contiguous. On account of the isolation trenches IG, the storage nodes SK directly adjoin the substrate 1 only in a contact region of a lateral surface of the associated first depression V1 (see FIG. 2A).

In order to produce insulations I, $SiO_2$ is deposited to a thickness of approximately 150 nm and planarized by chemical mechanical polishing until the mask of silicon nitride is uncovered. The insulations I are arranged in the isolation trenches IG (see FIGS. 2A and 2B).

With the aid of a first mask M made of photoresist which is in strip form and whose strips are approximately 300 nm wide, run parallel to the Y-axis Y and have a spacing of approximately 300 nm from one another, the substrate 1 is etched selectively with respect to the insulations I, so that second depressions V2 having a depth of approximately 300 nm are produced between each two of the first depressions V1 which are adjacent to one another along a row and have the spacing of approximately 750 nm from one another. The depressions V2 divide regions which are laterally surrounded by the isolation trenches IG into two halves of the same size (see FIGS. 3A and 3B).

The first mask M is removed.

In order to produce auxiliary spacers HS, silicon nitride is deposited to a thickness of approximately 50 nm and etched back until the surface of the substrate 1 is uncovered.

Figure 3A:
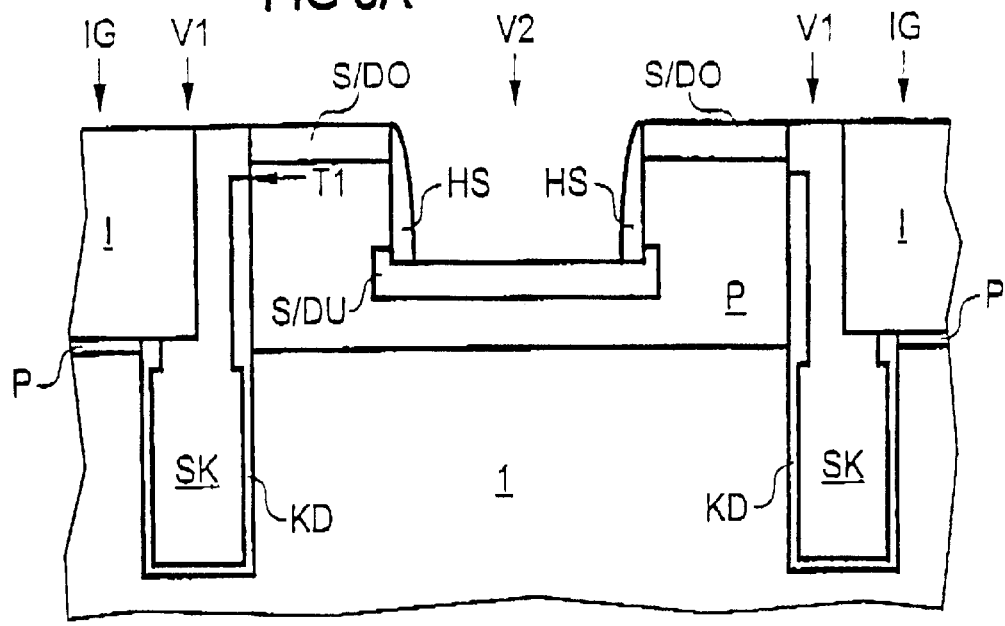
FIG. 3A is a further sectional view after second depressions, auxiliary spacers, lower source/drain regions and upper source/drain regions of transistors have been produced.

Afterwards, an implantation with n-doping ions is carried out, so that upper source/drain regions S/DO of transistors are produced between the second depressions V2 and the first depressions V1 and lower source/drain regions S/DU of the transistors are produced at bottoms of the second depressions V2 (see FIG. 3A). In this case, the auxiliary spacers HS protect the lateral surfaces of the second depressions V2 from implantation. The upper source/drain regions S/DO and the lower source/drain regions S/DU have a thickness of approximately 50 nm and have a dopant concentration of approximately $10^{19}$ $cm^{-3}$.

The auxiliary spacers HS are removed using $H_3PO_4$, for example.

Figure 4A:
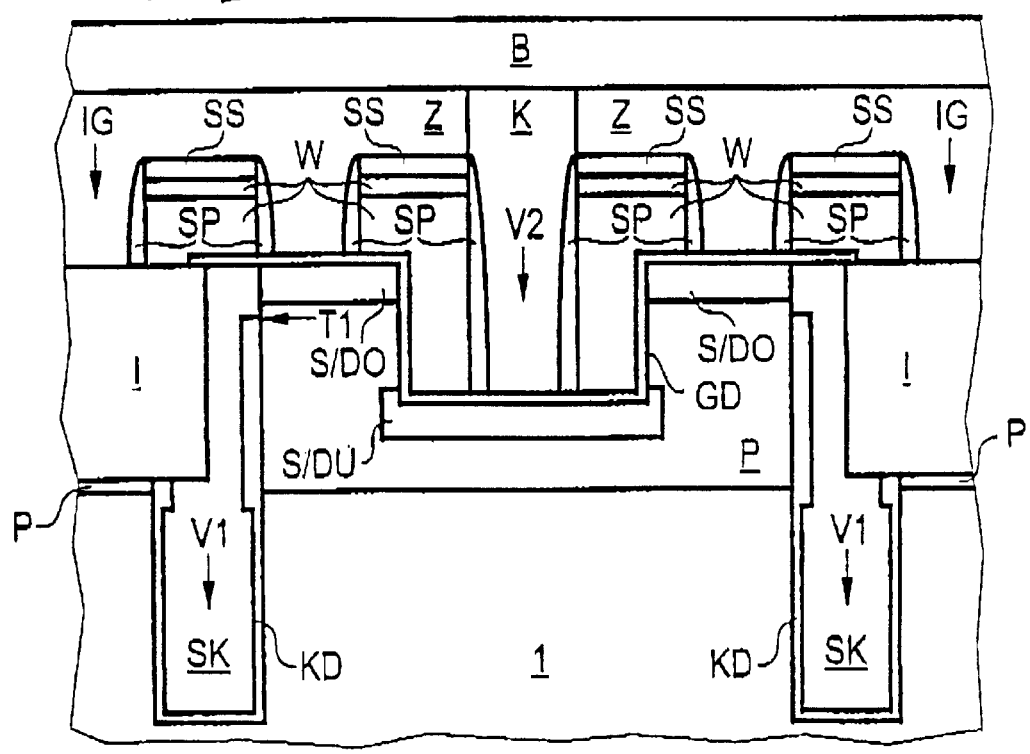
FIG. 4A is a sectional view similar to FIG. 3A after a gate dielectric, word lines, a protective layer, spacers, and intermediate oxide, bit line contacts and bit lines have been produced.

A gate dielectric GD having a thickness of approximately 6 nm is produced by thermal oxidation, said gate dielectric covering the bottoms and the lateral surfaces of the second depressions V2 and also the upper source/drain regions S/DO (see FIG. 4A).

Afterwards, polysilicon is deposited to a thickness of approximately 50 nm and planarized by chemical mechanical polishing. WSi is deposited over this to a thickness of approximately 100 nm and a protective layer SS made of silicon nitride and having a thickness of approximately 100 nm is deposited over this. With the aid of a second mask made of photoresist which is in strip form and whose strips are approximately 150 nm wide, run parallel to the Y-axis Y, cover the first depressions V1 and have a spacing of approximately 150 nm from one another, the polysilicon, the WSi and the protective layer SS are etched until parts of the gate dielectric GD are uncovered at the bottoms of the second depressions V2 (see FIG. 4A).

The second mask is removed.

Word lines W covered by the protective layer SS are produced from the polysilicon and the WSi during this process, which word lines act as gate electrodes in the region of the lateral surfaces of the second depressions V2.

In order to produce spacers SP, silicon nitride is deposited to a thickness of approximately 40 nm and etched back until the gate dielectric GD is uncovered at the bottoms of the second depressions V2 (see FIG. 4A). The word lines W are encapsulated by the protective layer SS and by the spacers SP.

In order to produce an intermediate oxide Z having a thickness of approximately 800 nm, $SiO_2$ is deposited to a thickness of approximately 1500 nm and planarized by chemical mechanical polishing. Masked etching is carried out to open contact holes to the bottoms of the second depressions V2, $SiO_2$ being etched electively with respect to silicon nitride. The lower source/drain regions S/DU are uncovered during this process (see FIG. 4A).

By depositing Ti/TiN/W and performing chemical mechanical polishing until the intermediate oxide Z is uncovered, bit line contacts K are produced in the contact holes (see FIGS. 4A and 4B).

In order to produce bit lines B, Al is deposited to a thickness of approximately 300 nm and patterned by masked etching in such a way that the bit lines B are approximately 150 nm wide, have a spacing of approximately 150 nm from one another, are arranged above the bit line contacts K and run parallel to the X-axis X (see FIGS. 4A and 4B).

The process described in the exemplary embodiment produces a DRAM cell configuration in which memory cells each comprise a transistor and a capacitor connected thereto. In each case two memory cells form a pair and are laterally surrounded by one of the isolation trenches IG. The transistors of the memory cells of a pair share the lower source/drain region S/DU. Parts of the doped layer P which are arranged between the lower source/drain region S/DU and the upper source/drain regions S/DO act as a channel region of the transistors.

There are many conceivable variations which likewise lie within the scope of the invention. Thus, dimensions of the above-described layers, lines, depressions, trenches, contacts, structures and masks can be adapted to the respective requirements. The same applies to the choice of materials.

We claim:

1. A DRAM cell configuration, comprising:
   a plurality of memory cells each having a capacitor and a transistor;
   a substrate having formed therein a first depression and a second depression spaced apart from said first depression;
   said capacitor being formed as a vertical capacitor having a storage node disposed in said first depression, and a capacitor dielectric in said first depression between said storage node and said substrate;
   said storage node adjoining said substrate at least in a contact region of a lateral surface of said first depression;
   said transistor having a gate electrode in said second depression at least at a first lateral surface of said second depression;
   a gate dielectric adjoining at least the first lateral surface and isolating said gate electrode from said substrate;
   said transistor having an upper source/drain region disposed in said substrate adjoining said second depression, and adjoining said storage node in the contact region of said lateral surface of said first depression; and said transistor having a lower source/drain region disposed deeper in said substrate than said upper source/drain region and adjoining said second depression.

2. The DRAM cell configuration according to claim 1, wherein said first lateral surface of said second depression faces towards said first depression, and said lateral surface of said first depression faces towards said second depression.

3. The DRAM cell configuration according to claim 1, wherein said upper source/drain region adjoins a surface of said substrate from which said first depression and said second depression proceed.

4. The DRAM cell configuration according to claim 1, wherein at least a portion of said lower source/drain region is arranged below said second depression and adjoins a floor of said second depression.

5. The DRAM cell configuration according to claim 1, wherein said storage node adjoins said substrate only in a contact region of said lateral surface of said first depression.

6. The DRAM cell configuration according to claim 2, wherein:
said second depression is associated with a first memory cell and to a second memory cell;
said gate electrode of said transistor of said first memory cell is arranged at said first lateral surface of said second depression;
said gate electrode of said transistor of said second memory cell is arranged at a second lateral surface of said second depression opposite said first lateral surface of said second depression, and is isolated from said substrate by said gate dielectric which also adjoins at least said second lateral surface of said second depression;
said gate electrode of said transistor of said second memory cell is isolated from said gate electrode of said transistor of said first memory cell;
said second depression is arranged between said first depression of said first memory cell and said first depression of said second memory cell; and
said lower source/drain region of said transistor of said first memory cell corresponds to said lower source/drain region of said transistor of said second memory cell.

7. The DRAM cell configuration according to claim 6, which comprises a bit line contact between said gate electrode of said transistor of said first memory cell and said gate electrode of said transistor of said second memory cell, and wherein said bit line contact reaches down to said lower source/drain region of said transistor of said first memory cell and is insulated from said gate electrode of said transistor of said first memory cell and from said gate electrode of said transistor of said second memory cell.

8. The DRAM cell configuration according to claim 6, wherein an isolation trench filled with an insulation is formed in said substrate, said trench laterally surrounds the second depression, at least a portion of said first depression of said first memory cell, and at least a portion of said first depression of said second memory cell such that said second depression adjoins part of said isolation trench and part of said isolation trench opposite therefrom.

9. The DRAM cell configuration according to claim 8, wherein said isolation trench reaches more deeply into said substrate than said lower source/drain region of said transistor of said first memory cell.

10. The DRAM cell configuration according to claim 8, wherein:

said first memory cell and said second memory cell form a first pair;
a plurality of further pairs are configured analogously to said first pair;
said pairs are arranged in rows;
a bit line runs along each of said rows;
said pairs are arranged such that said first depressions and said second depressions of said pairs of a given row are arranged adjacent one another along said row;
word lines extend transversely to said rows;
mutually adjacent word lines of said word lines are equally spaced from one another;
said word lines in each case alternately cover said first depressions and overlap said second depressions; and
said gate electrodes of said transistors of said memory cells are parts of said word lines.

11. A method of fabricating a DRAM cell configuration, which comprises:
producing memory cells each having a capacitor and a transistor;
producing the transistor as a vertical transistor;
forming a first depression in a substrate for the capacitor;
providing the first depression with a capacitor dielectric;
producing a storage node of the capacitor in the first depression, whereby the storage node adjoins the substrate at least in a contact region of a lateral surface of the first depression;
producing a second depression at a spacing from the first depression;
producing a gate electrode of the transistor in the second depression at least at a first lateral surface of the second depression and isolating the gate electrode from the substrate with a gate dielectric adjoining at least the first lateral surface;
producing an upper source/drain region of the transistor adjoining the second depression and adjoining the storage node in the contact region of the lateral surface of the first depression; and
producing a lower source/drain region of the transistor deeper in the substrate than the upper source/drain region and adjoining the second depression.

12. The method according to claim 11, which comprises forming the gate electrode such that the first lateral surface of the second depression faces towards the first depression, and wherein the lateral surface of the first depression faces the second depression.

13. The method according to claim 11, which comprises producing the upper source/drain region to adjoin a surface of the substrate from which the first depression and the second depression proceed.

14. The method according to claim 11, which comprises, subsequently to the step of forming the second depression, carrying out an implantation step to produce the lower source/drain region to thereby adjoin the lower source/drain region to a bottom of the second depression.

15. The method according to claim 12, wherein:
the second depression is formed for a first memory cell and a second memory cell;
the gate electrode of the transistor of the first memory cell is produced at the first lateral surface of the second depression;
the gate electrode of the transistor of the second memory cell is produced at a second lateral surface of the second depression, wherein the second lateral surface is opposite the first lateral surface of the second depression, and is isolated from the substrate by the gate dielectric, which is produced to also adjoins at least the second lateral surface of the second depression;

the gate electrode of the transistor of the second memory cell is isolated from the gate electrode of the transistor of the first memory cell;

the step of forming the second depression comprises arranging the second depression between the first depression of the first memory cell and the first depression of the second memory cell; and the lower source/drain region of the transistor of the first memory cell corresponds to the lower source/drain region of the transistor of the second memory cell.

16. The method according to claim 15, which further comprises producing a bit line contact between the gate electrode of the transistor of the first memory cell and the gate electrode of the transistor of the second memory cell, wherein the bit line contact reaches down to the lower source/drain region of the transistor of the first memory cell and is insulated from the gate electrode of the transistor of the first memory cell and from the gate electrode of the transistor of the second memory cell.

17. The method according to claim 15, which further comprises forming an isolation trench laterally surrounding a given region of the substrate and filling the isolation trench with an insulation;

wherein the first depression of the first memory cell and the first depression of the second memory cell are formed such that at least a portion of the first depression of the first memory cell encompassing the contact region of the associated lateral surface, and at least a portion of the first depression of the second memory cell encompassing the contact region of the associated lateral surface, are arranged within the region of the substrate; and wherein the step of forming the second depression comprises placing a mask which does not cover a strip traversing the given region of the substrate, and anisotropically etched the substrate selectively with respect to the insulation.

18. The method according to claim 17, which comprises forming the isolation trench more deeply than the lower source/drain region of the transistor of the first memory cell.

19. The method according to claim 17, which comprises:

forming the first depression before the isolation trench;

producing the capacitor dielectric to cover a floor of the first depression and sidewalls of the first depression up to a first depth below a surface of the substrate;

subsequently to producing the capacitor dielectric, producing the storage node to fill the first depression at least up to the surface of the substrate; and producing the isolation trench to reach down into the storage node, deeper than the first depth, and to overlap the first depression such that the storage node adjoins the substrate only in the contact region of the lateral surface of the first depression.

20. The method according to claim 15, which comprises:

producing the first memory cell and the second memory cell as a first pair;

producing a plurality of pairs configured analogously to the first pair;

arranging the pairs in rows;

producing bit lines each running along one of the rows;

arranging the pairs such that the first depressions and the second depressions of pairs of a row are arranged next to one another along the row;

producing word lines extending transversely with respect to the rows;

spacing the word lines such that mutually adjacent word lines are equidistant from one another;

arranging the pairs such that the word lines in each case alternately cover first depressions and overlap second depressions; and producing the gate electrodes of the transistors of the memory cells as parts of the word lines.

* * * * *